(12) United States Patent
Herber et al.

(10) Patent No.: US 11,515,701 B2
(45) Date of Patent: Nov. 29, 2022

(54) COUPLING CIRCUIT WITH SWITCHING FUNCTION FOR COUPLING AN INSULATION MONITORING DEVICE TO AN UNEARTHED POWER SUPPLY SYSTEM

(71) Applicant: BENDER GMBH & CO. KG, Gruenberg (DE)

(72) Inventors: Andreas Herber, Muecke (DE); Gerd Joachim Klostermann, Hohenahr (DE)

(73) Assignee: BENDER GMBH & CO. KG, Gruenberg (DE)

( * ) Notice: Subject to any disclaimer, the term of this patent is extended or adjusted under 35 U.S.C. 154(b) by 731 days.

(21) Appl. No.: 16/401,767

(22) Filed: May 2, 2019

(65) Prior Publication Data

US 2019/0339314 A1 Nov. 7, 2019

(30) Foreign Application Priority Data

May 4, 2018 (DE) ..................... 10 2018 110 709.9

(51) Int. Cl.
*H02H 3/16* (2006.01)
*G01R 27/18* (2006.01)
(Continued)

(52) U.S. Cl.
CPC .............. *H02H 3/162* (2013.01); *G01R 27/18* (2013.01); *G01R 27/2688* (2013.01); *G01R 31/52* (2020.01)

(58) Field of Classification Search
CPC .... G01R 31/1272; G01R 31/52; G01R 31/14; G01R 27/025; G01R 31/08; G01R 31/086;
(Continued)

(56) References Cited

U.S. PATENT DOCUMENTS 4,697,096 A 9/1987 Conrad et al.
5,712,572 A * 1/1998 Tamechika ........... G01R 31/129
324/551
(Continued)

FOREIGN PATENT DOCUMENTS

DE 102010006108 A1 8/2011
DE 102013226595 A1 6/2015
(Continued)

OTHER PUBLICATIONS

Wang, et al.; High Performance Solid-State Switches Using Series-Connected SiC-MOSFETs for High Voltage Applications; Power Electronic & Motion Control Research Center, Shenzhen Graduate School of Harbin Institute of Technology; China; 2016.

*Primary Examiner* — Amy He
(74) *Attorney, Agent, or Firm* — Dickinson Wright PLLC; Andrew D. Dorisio

(57) ABSTRACT

A coupling circuit (20) with switching function for coupling an insulation monitoring device (6, 6a, 6b) to an unearthed power supply system (2, 2a, 2b), consisting of a coupling module (22) or a plurality of identical coupling modules (22) connected in series, wherein the coupling module (22) has at least one switch unit (25), which comprises a coupling impedance (26), a switch (24), arranged in series to the coupling impedance (26), for mains disconnection and a control circuit (28) for controlling the switch (24), and also exactly one transformer (30) for voltage supply and for potential separation.

4 Claims, 3 Drawing Sheets

(51) Int. Cl.
*G01R 27/26* (2006.01)
*G01R 31/52* (2020.01)
(58) Field of Classification Search
CPC .... G01R 27/18; G01R 27/2688; G01R 31/12; G01R 27/02; H02H 1/0007; H02H 3/16; H02H 3/162; H02H 3/165; H02H 11/005; H02H 3/20; H02H 3/202; H02J 13/0004
See application file for complete search history.

(56) References Cited

U.S. PATENT DOCUMENTS

2013/0194706 A1* 8/2013 Har-Shai .................. H02J 1/00
 361/42
2014/0152329 A1* 6/2014 Hofheinz ............... G01R 1/206
 324/691

FOREIGN PATENT DOCUMENTS

| | | |
|---|---|---|
| EP | 2741089 A2 | 6/2014 |
| JP | 2001284095 A | 10/2001 |
| WO | 2018029928 A1 | 2/2018 |

* cited by examiner ic infrastructures, fields used in medicine and power
COUPLING CIRCUIT WITH SWITCHING FUNCTION FOR COUPLING AN INSULATION MONITORING DEVICE TO AN UNEARTHED POWER SUPPLY SYSTEM The disclosure of German Patent Application No. 10 2018 110 709.9, filed May 4, 2018, is incorporated herein by reference.

TECHNICAL FIELD

The invention relates to a coupling circuit with switching function for coupling an insulation monitoring device to an unearthed power supply system.

BACKGROUND

Unearthed power supply systems (IT systems—Fr. "Isolé Terre") are predominantly used in sensitive energy supply networks, where in addition to increased protection, high availability is also important. The application areas mining, power generation (photovoltaics and wind power), communication infrastructures, fields used in medicine and power supply networks on ships and offshore devices could be mentioned here for example. The advantage of an unearthed network consists in the fact that in the event of an insulation fault, such as an earth contact or a body contact for example, the function of the connected electrical consumers is not impaired, as a closed electrical circuit cannot form owing to the ideally infinitely large impedance value between an active conductor of the network and earth. That is to say the network can even be operated further in the case of a first insulation fault.

However, the resistance of the unearthed power supply system to earth (insulation resistance—in the case of a fault also insulation fault resistance or fault resistance) is to be monitored constantly, as a fault loop would be created by a possible further fault at a different active conductor and the fault current flowing in that case in connection with an overcurrent protection device would result in the system being switched off with operational stoppage. In relevant standards, the use of an insulation monitoring device (IMD) is therefore demanded in the unearthed power supply system.

If a plurality of unearthed power supply systems are temporarily electrically connected to one another, this results in the problem that the individual insulation monitoring devices may influence one another. Reliable operation of the insulation monitoring devices and therefore the reliable determination of the insulation resistance are no longer ensured. In order to prevent this negative influencing, the connected insulation monitoring devices except one are disconnected from the unearthed power supply systems which are coupled to one another. This mains disconnection may take place by means of (mains disconnect) switches which are external or integrated in the insulation monitoring device.

In the case of a low-resistance earth contact in an unearthed power supply system, the (external) line voltage (nominal mains voltage) of a non-faulty conductor is applied at the switch. The switch must therefore be able to safely disconnect this voltage.

In the event of the nominal voltage of an unearthed power supply system exceeding the rated voltage of the insulation monitoring device, the insulation monitoring device must be connected to the unearthed power supply system by means of a coupling impedance. This ensures that the insulation monitoring device is not operated outside of its specification.

A switch, which is integrated in the insulation monitoring device or is externally arranged between the insulation monitoring device and coupling impedance, forms a series circuit with the coupling impedance. If the switch is open, this has a very high resistance with respect to the coupling impedance, which means that the voltage of the unearthed power supply system drops almost completely over the switch in the event of an earth contact. The destruction of the switch and a danger for persons and the electrical system would be the consequence.

Even the control circuit of the switch, regardless of whether this is operated mechanically, electromagnetically or electronically, must bridge the potential difference between the switch potential, which in the closed state of the switch is close to the earth potential as a consequence of the voltage drop over the coupling impedance, and the potential applied at the coupling impedance if the switch is open, which corresponds to the nominal mains voltage. In addition to the risk of overloading the switch and the switch control circuit, the effort in terms of circuitry and therefore the costs for such a potential separation become very high.

It is known from the prior art to use switches suitable for high voltage from the field of energy supply. These switches are capable of switching high voltages in connection with high currents. In order to be able to achieve this, the switches are of very large and complex design, which leaves them appearing overdimensioned and clearly too expensive in the present circumstances—high voltage with low currents.

Alternatively, it is known to use mechanical switches, for example Reed relays or semiconductor-style switches. However, relay contacts entail the disadvantages of mechanical switches, the number of switching processes is limited and a considerably higher energy demand is required for switching. Semiconductor-style switches are predominantly of unipolar configuration. However, as AC voltages are also used in unearthed power supply systems, they are not suitable without further switching measures.

For a control according to the prior art of the semiconductor switches, the switch control must produce the potential separation between semiconductor switch potential and control potential. In the case of a coupling impedance to an unearthed power supply system with a nominal voltage of 6.6 kV for example, even this 6.6 kV would have to be bridged by the control circuit. Even for this voltage range, no control circuits are available on the market for simple semiconductor switches. Furthermore, with increasing nominal voltage of the unearthed power supply system, even the effort for potential separation would increase strongly.

For voltage ranges above 1.5 kV in particular, no closed solution is currently available. The operator of the electrical system must select a suitable high-voltage switch and install it between the coupling impedance and the unearthed power supply system or, if the electrical system is switched to zero potential, manually disconnect the insulation monitoring devices not currently being used for measurement from the mains.

SUMMARY

The present invention is therefore based on the object of suggesting a device for coupling an insulation monitoring device to an unearthed power supply system, which device is capable of safely disconnecting the insulation monitoring device from the unearthed power supply system, particularly in ranges of the nominal mains voltage of more than 1.5 kV. In addition, with respect to the costs aspect, it should be possible to dispense with overdimensioned mains disconnect switches.

This object is achieved by a coupling circuit with switching function, which consists of a coupling module or a plurality of identical coupling modules connected in series, wherein the coupling module has at least one switch unit, which comprises a coupling impedance, a switch, arranged in series to the coupling impedance, for mains disconnection and a control circuit for controlling the switch, and also exactly one transformer for voltage supply and for potential separation.

The present invention is therefore based on the fundamental idea of structuring a coupling circuit in a modular manner, that is to say consisting of one or more identical coupling modules connected in series. For example, if a potential difference of 12 kV is to be bridged between the active conductors and earth, then the coupling circuit may consist of four identical coupling modules, which bridge a potential difference of 3 kV in each case.

A coupling module in turn has at least one switch unit and precisely one transformer. Preferably, the potential difference to be overcome per coupling module is distributed over a plurality of switch units connected in series. Thus, for example, the above-mentioned potential difference of 3 kV per coupling module may be processed by three switch units connected in series, which overcome a potential difference of 1 kV in each case. The switch unit has a series circuit made up of coupling impedance and switch, wherein the switch is switched by means of a control circuit. The coupling module additionally comprises precisely one transformer, which supplies the control circuit or the control circuits with a voltage. Furthermore, the transformer takes on the task of potential separation between a semiconductor switch potential and a control potential of the switch realized as a semiconductor.

In the modular structure according to the invention, each coupling module comprises all of the circuitry components required for operation and can therefore be considered as autonomous with the exception of voltage supply. Each coupling module produces the potential separation to the adjacent coupling modules—that is to say to the upstream-connected coupling module of a lower voltage level and to the downstream-connected coupling module of a higher voltage level. All of the coupling modules have the same potential separation capability. By means of the series connection of the modules and the resultant bridgeable potential differences, a required coupling impedance can easily be adapted to the different nominal voltages of the unearthed power supply system. As each coupling module only has to ensure the potential difference to the adjacent coupling module, the control of the semiconductor switches is relatively simple, as no potential differences, which cannot be bridged or can only be bridged with unacceptable effort, occur inside a potential level.

In a further advantageous embodiment, the transformer is connected at the input side to an external power supply unit or to a voltage output of a transformer of an upstream-connected coupling module and has voltage outputs which are realized for voltage supply and potential separation of the control circuit or the control circuits and for voltage supply of a further coupling module.

The coupling module therefore has a transformer, which is either supplied by an external power supply unit—if the coupling module is used as a basic module for bridging the difference at the lowest voltage level—or by the output of a transformer of an upstream-connected coupling module. The remaining voltage outputs of the transformer are used for voltage supply of the control circuit of the respective switch units inside the coupling module. Advantageously, the control circuit is constructed as a rectifier circuit consisting of a rectifier diode, an RC element for smoothing, a Zener diode for setting a gate voltage and a gate discharge resistance.

BRIEF DESCRIPTION OF THE DRAWINGS

Further advantageous design features result from the following description and the drawings which explain a preferred embodiment of the invention on the basis of examples. In the figures.

DETAILED DESCRIPTION

Figure 1:
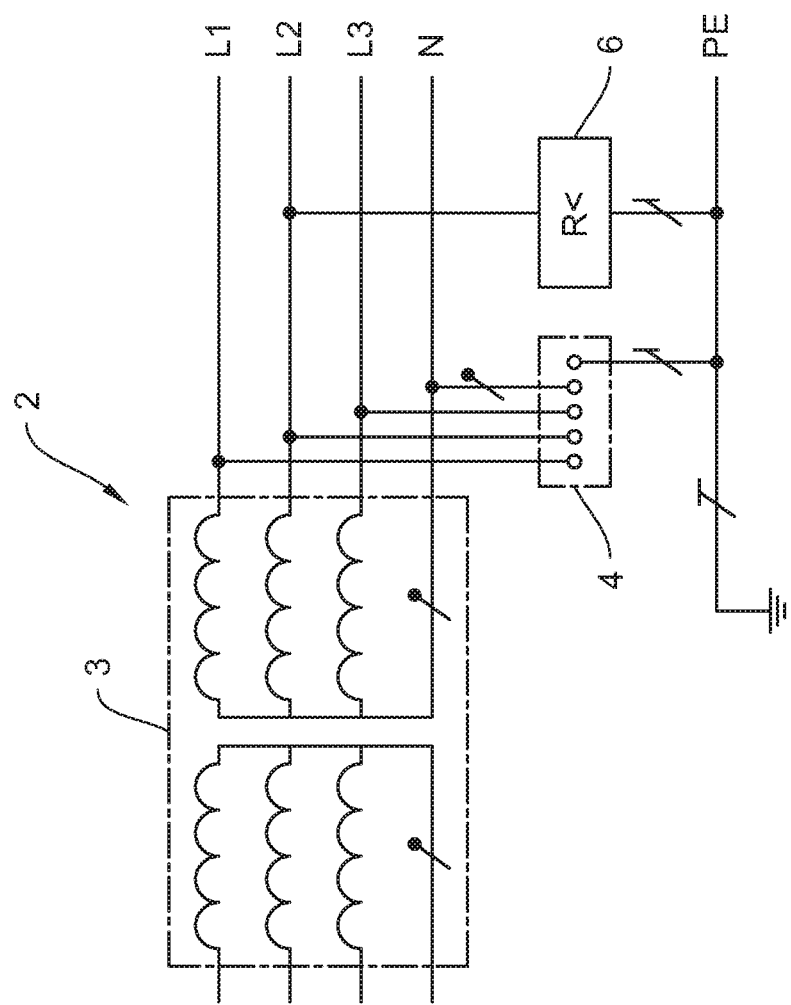
FIG. 1 shows an unearthed power supply system with insulation monitoring device.

FIG. 1 shows an unearthed power supply system in the form of a three-phase AC voltage network with three active conductors L1, L2, L3 and a neutral conductor N. The system is supplied by a current source 3 (transformer) and is loaded with a consumer 4. The body of the consumer 4 is connected to earth potential (earth) by means of the protective-earth conductor PE.

For insulation monitoring, the unearthed power supply system 2 is connected to an insulation monitoring device 6, which is here connected between the active conductor L2 and the protective-earth conductor PE.

If the insulation resistance falls below a preset value, then this undershooting is detected by the insulation monitoring device 6 and an alarm is output. The unearthed power supply system 2 can be operated further in the event of this first case of a fault, so that the consumer 4 is also further supplied with current.

Figure 2:
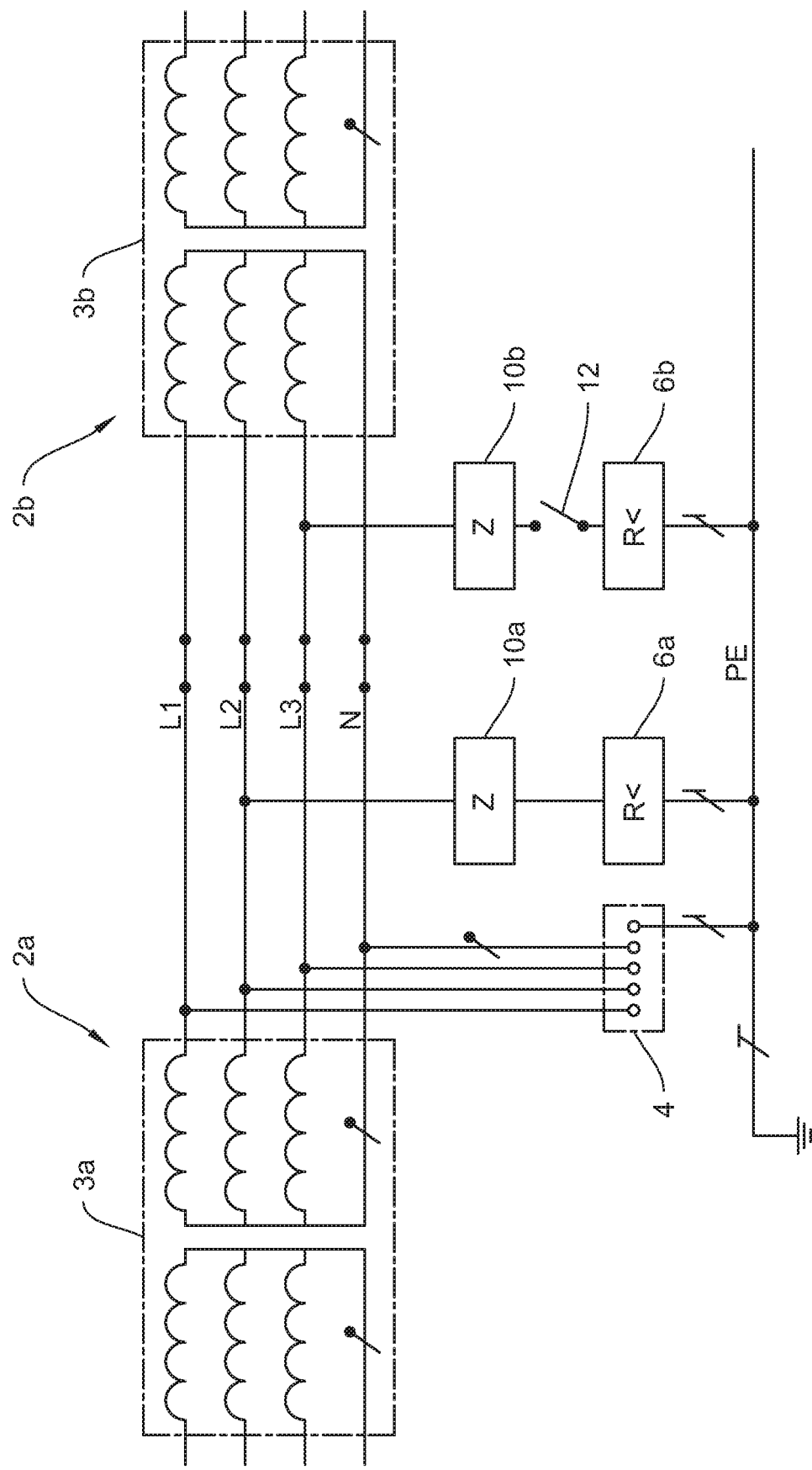
FIG. 2 shows two coupled unearthed power supply systems with insulation monitoring devices and coupling impedances.

Two unearthed power supply systems 2a, 2b, which are coupled to one another, are illustrated in FIG. 2. The unearthed power supply systems 2a, 2b have a separate current source 3a, 3b in each case. The consumer 4 is connected to the active conductors L1, L2, L3, the body of which consumer is connected to earth potential via the protective-earth conductor PE.

The unearthed power supply systems 2a, 2b are in each case equipped with a separate insulation monitoring device 6a, 6b. So that the insulation monitoring devices 6a, 6b are operated inside the specified range with regards to their rated voltage, a coupling resistor 10a, 10b is provided in the coupling branch of the respective insulation monitoring device 6a, 6b in each case.

In order to prevent mutual influencing during insulation resistance measurement, one of the measurement paths for insulation resistance measurement has a mains disconnect switch 12, using which the insulation monitoring device located in this measurement branch can be disconnected from the unearthed power supply system 2a, 2b. In the closed state of the switch, the same is virtually at earth potential—the internal resistance of the insulation monitoring device is disregarded—but, in the event of opening, must overcome the potential difference to the line-earth voltage (in the case of no fault) or to the nominal voltage (in the case of a fault) of the unearthed power supply system 2a, 2b.

As mentioned at the beginning, switches of this type according to the prior art are of very complex design or overdimensioned and unacceptably expensive for the present case of low current intensities.

Figure 3:
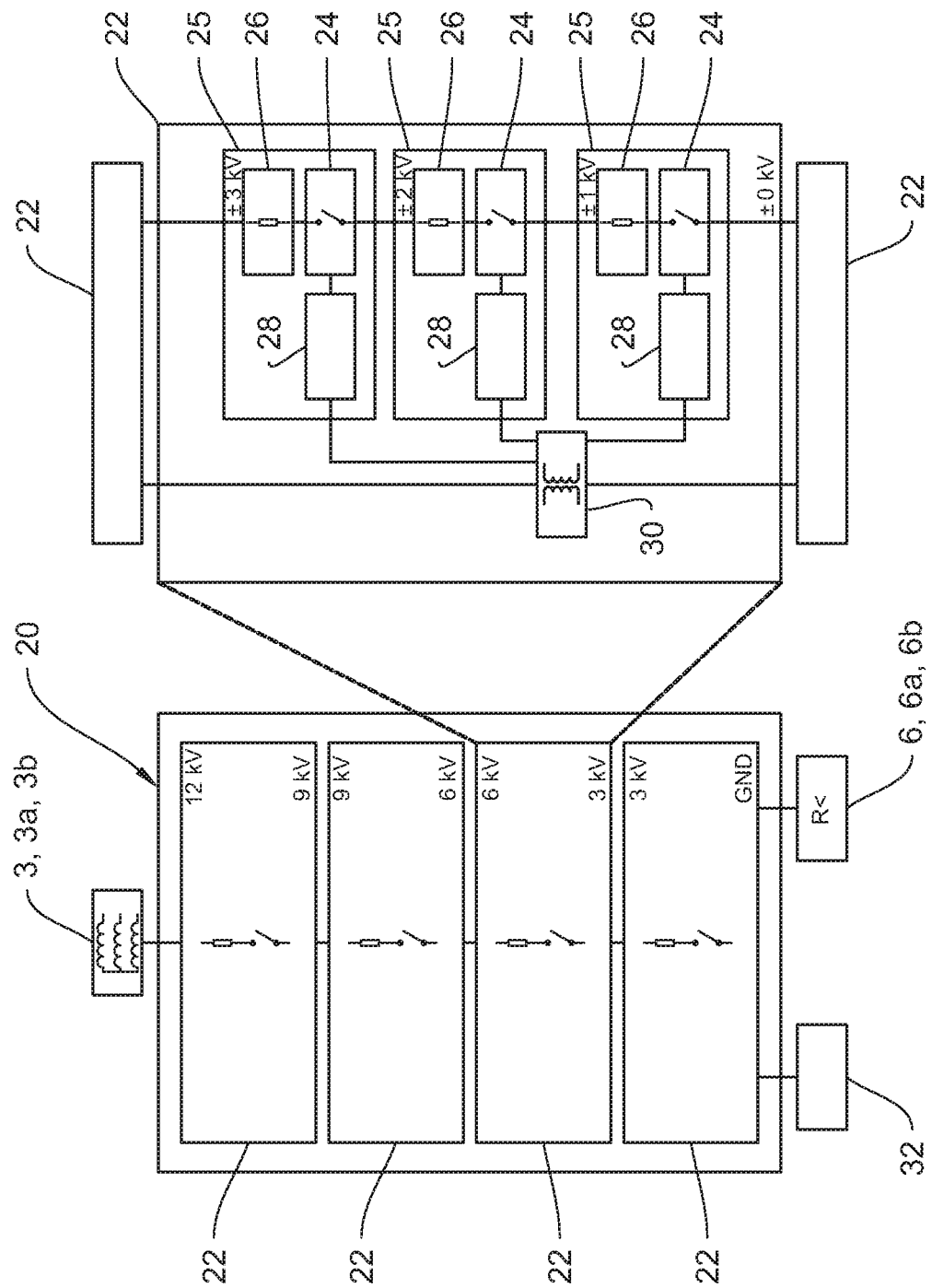
FIG. 3 shows an exemplary embodiment of a coupling circuit according to the invention with four coupling modules.

FIG. 3 shows an exemplary embodiment of a coupling circuit 20 according to the invention with four coupling modules 22. The coupling circuit 20 is connected between the insulation monitoring device 6, 6a, 6b and the unearthed power supply system 2, 2a, 2b. The coupling circuit 20 is of modular construction internally and has voltage levels, the potential difference of which is bridged by four identical coupling modules 22, which are connected in series. Each coupling module 22 in turn has three identical switch units 25. Each switch unit 25 comprises a coupling impedance 25, a switch 24 arranged in series to the coupling impedance 26 and a control circuit 28 for controlling the switch. The coupling module 22 furthermore has a transformer 30, which is supplied either by an external power supply unit 32 or by a voltage output of a transformer 30 of the upstream-connected coupling module 22 and the voltage outputs thereof supply the control circuit of the respective switch units 25 of the relevant coupling module 22. In addition to the voltage supply for the control circuits 28, the transformer 30 also ensures the potential separation between the individual coupling modules 22 and inside the coupling modules 22 between the switch units 25. In the illustrated example, a potential difference of 12 kV is to be overcome. This is achieved by four identical coupling modules 22, which have a potential separation capability of 3 kV in each case. Three switch units 25, which bridge a potential difference of 1 kV in each case, are located inside the coupling modules 22.

The switches 24 are constructed using commercially available MOSFET semiconductors and connected such that they can disconnect both DC voltages and AC voltages.

Thus, if the transformer is supplied with energy, then all semiconductor switches of the coupling circuit become conductive and the insulation monitoring device is connected to the IT system by means of the coupling impedance. If the transformer is not supplied with energy, the gates of the MOSFETs discharge via the gate discharge resistances and disable the MOSFETs. The insulation monitoring device is then disconnected from the unearthed power supply system.

The invention claimed is:

1. A coupling circuit (20) with switching function for coupling an insulation monitoring device (6, 6a, 6b) to an unearthed power supply system (2, 2a, 2b), the coupling circuit (20) comprising a coupling module (22) or a plurality of identical coupling modules (22) connected in series, each coupling module (22) comprising exactly one transformer (30) for voltage supply and for separation between the plurality of coupling modules (22), each coupling module (22) further comprising at least one switch unit (25), the at least one switch unit (25) comprising a coupling impedance (26), a switch (24) for mains disconnection that is arranged in series to the coupling impedance (26), and a control circuit (28) for controlling the switch (24).

2. The device according to claim 1, characterized in that the transformer (30) is connected at the input side to an external power supply unit (32) or to a voltage output of a transformer (30) of an upstream-connected coupling module (22) and has voltage outputs which are realized for voltage supply and potential separation of the control circuit (28)/the control circuits (28) and for voltage supply of a further coupling module (22).

3. The device according to claim 1, characterized in that the switch (24) is constructed as a semiconductor switch.

4. The device according to claim 1, characterized in that the control circuit (28) is constructed as a rectifier circuit consisting of a rectifier diode, an RC element for smoothing, a Zener diode for setting a gate voltage and a gate discharge resistance.

\* \* \* \* \*